United States Patent
Yanagidaira et al.

(10) Patent No.: US 8,742,822 B2
(45) Date of Patent: Jun. 3, 2014

(54) LEVEL SHIFT CIRCUIT

(71) Applicant: Kabushiki Kaisha Toshiba, Tokyo (JP)

(72) Inventors: Kosuke Yanagidaira, Kanagawa (JP); Shouichi Ozaki, Kanagawa (JP); Kenro Kubota, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/752,501

(22) Filed: Jan. 29, 2013

(65) Prior Publication Data
US 2014/0049308 A1 Feb. 20, 2014

Related U.S. Application Data

(60) Provisional application No. 61/683,981, filed on Aug. 16, 2012.

(51) Int. Cl.
*H03L 5/00* (2006.01)
(52) U.S. Cl.
USPC ............... 327/333; 326/62; 326/81; 326/175
(58) Field of Classification Search
USPC ................. 326/62–63, 80–81; 327/306, 333, 327/172–175
See application file for complete search history.

(56) References Cited

U.S. PATENT DOCUMENTS

| 5,907,357 | A | 5/1999 | Maki |
| 6,501,313 | B2 * | 12/2002 | Boerstler et al. ............... 327/175 |
| 6,897,696 | B2 * | 5/2005 | Chang ........................ 327/175 |
| 6,972,446 | B1 | 12/2005 | Atsumi |

FOREIGN PATENT DOCUMENTS

| JP | 8-264757 | 10/1996 |
| JP | 10-242434 | 9/1998 |
| JP | 2002-335154 | 11/2002 |
| JP | 2003-69414 | 3/2003 |
| JP | 2004-15714 | 1/2004 |
| JP | 2011-71753 | 4/2011 |

* cited by examiner

*Primary Examiner* — Dinh T. Le
(74) *Attorney, Agent, or Firm* — Oblon, Spivak, McClelland, Maier & Neustadt, L.L.P.

(57) ABSTRACT

According to one embodiment, a first CMOS inverter receives an input signal corresponding to a first power supply voltage, and is driven by a second power supply voltage which is smaller than the first power supply voltage; a second CMOS inverter is connected to a rear stage of the first CMOS inverter, and is driven by the second power supply voltage; a first driving adjustment circuit adjusts a current driving force of a low level output of the first CMOS inverter; and a second driving adjustment circuit adjusts a current driving force of a low level output of the second CMOS inverter.

20 Claims, 3 Drawing Sheets

LEVEL SHIFT CIRCUIT

CROSS-REFERENCE TO RELATED APPLICATIONS

This application is based upon and claims the benefit of priority from Provisional Patent Application No. 61/683,981, filed on Aug. 16, 2012; the entire contents of which are incorporated herein by reference.

FIELD

Embodiments disclosed herein relate generally to a level shift circuit.

BACKGROUND

Semiconductor devices may be supplied with an external power source voltage in order to make internal circuit characteristics well balanced through level shifting. At this time, when a delay time in a rising edge and a delay time in a falling edge of an output voltage are largely different from each other, a duty ratio of the output voltage is significantly deviated, so that an operation margin is reduced significantly.

DETAILED DESCRIPTION

In general, according to one embodiment, a first CMOS inverter, a second CMOS inverter, a first driving adjustment circuit, and a second driving adjustment circuit are provided. The first CMOS inverter receives an input signal corresponding to a first power supply voltage, and is driven by a second power supply voltage smaller than the first power supply voltage. The second CMOS inverter is connected to a rear stage of the first CMOS inverter, and is driven by the second power supply voltage. The first driving adjustment circuit adjusts a current driving force of a low level output of the first CMOS inverter. The second driving adjustment circuit adjusts the current driving force of a low level output of the second CMOS inverter.

Level shift circuits according to the embodiments will be described in detail with reference to the accompanying drawings. Note that the current invention is not limited to these embodiments.

First Embodiment

Figure 1:
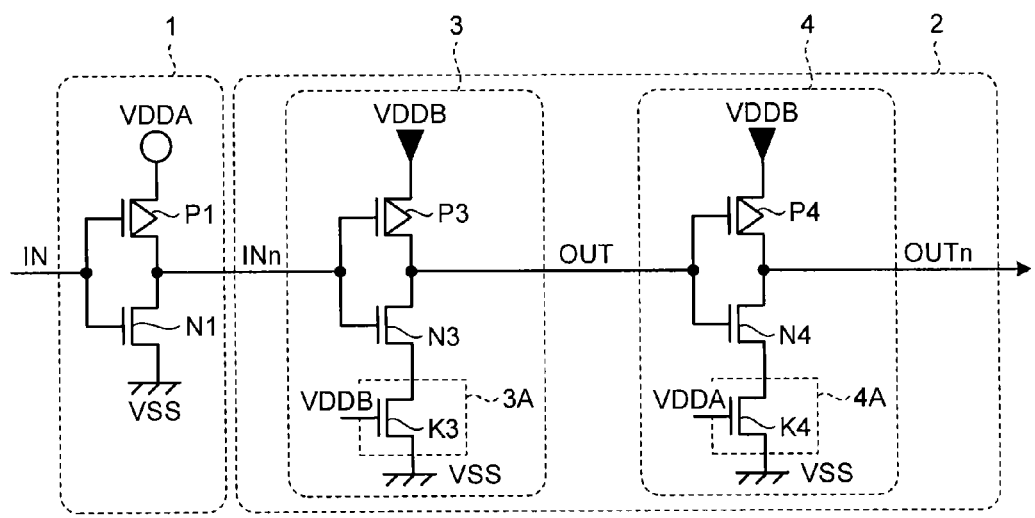
FIG. 1 is a circuit diagram schematically illustrating a configuration of a level shift circuit according to a first embodiment.

FIG. 1 is a circuit diagram schematically illustrating a configuration of a level shift circuit according to a first embodiment.

Referring to FIG. 1, a level shift circuit 2 is provided with CMOS inverters 3 and 4, and the CMOS inverter 4 is connected to a rear stage of the CMOS inverter 3. Further, the level shift circuit 2 can make level shifting of a signal from a high voltage to a low voltage in a DDR (Double Data Rate) interface. A CMOS inverter 1 is connected to a front stage of the CMOS inverter 3.

The CMOS inverter 1 is driven by a first power supply voltage VDDA, and can make an input signal IN inverted. The CMOS inverter 3 is driven by a second power supply voltage VDDB, and can make an input signal INn from the CMOS inverter 1 inverted. The CMOS inverter 4 is driven by the second power supply voltage VDDB, and can make an output signal OUT from the CMOS inverter 3 inverted. Note that the second power supply voltage VDDB can be set to be lower than the first power supply voltage VDDA.

Herein, the level shift circuit 2 can compensate a delay time in a rising edge of an output voltage from the CMOS inverter 3 at the front stage with a delay time in the falling edge of an output voltage from the CMOS inverter 4 at the rear stage. Further, the level shift circuit 2 can compensate a delay time in a falling edge of the output voltage from the CMOS inverter 3 at the front stage with a delay time in a rising edge in the output voltage from the CMOS inverter 4 at the rear stage.

In addition, the CMOS inverter 3 is provided with a driving adjustment circuit 3A, and the CMOS inverter 4 is provided with a driving adjustment circuit 4A. The driving adjustment circuit 3A can adjust the current driving force of the low level output of the CMOS inverter 3. The driving adjustment circuit 4A can adjust the current driving force of the low level output of the CMOS inverter 4.

Specifically, the CMOS inverter 1 is provided with a P-channel field-effect transistor P1 and an N-channel field-effect transistor N1. The CMOS inverter 3 is provided with a P-channel field-effect transistor P3 and an N-channel field-effect transistor N3. The CMOS inverter 4 is provided with a P-channel field-effect transistor P4 and an N-channel field-effect transistor N4. The driving adjustment circuit 3A is provided with an N-channel field-effect transistor K3. The driving adjustment circuit 4A is provided with an N-channel field-effect transistor K4.

The P-channel field-effect transistor P1 and the N-channel field-effect transistor N1 are connected in series to each other. A source of the P-channel field-effect transistor P1 is connected to the first power supply voltage VDDA, and a source of the N-channel field-effect transistor N1 is connected to a third power supply voltage VSS. Further, the third power supply voltage VSS can be set to be lower than the second power supply voltage VDDB, for example, to a ground potential. A gate of the P-channel field-effect transistor P1 and a gate of the N-channel field-effect transistor N1 receive the input signal IN.

In addition, the P-channel field-effect transistor P3 and the N-channel field-effect transistor N3 are connected in series to each other. A source of the P-channel field-effect transistor P3 is connected to the second power supply voltage VDDB, and a source of the N-channel field-effect transistor N3 is connected to a drain of the N-channel field-effect transistor K3. A source of the N-channel field-effect transistor K3 is connected to the third power supply voltage VSS. A gate of the P-channel field-effect transistor P3 and a gate of the N-channel field-effect transistor N3 receive the input signal INn. A gate of the N-channel field-effect transistor K3 receives the second power supply voltage VDDB.

In addition, the P-channel field-effect transistor P4 and the N-channel field-effect transistor N4 are connected in series to each other. A source of the P-channel field-effect transistor P4 is connected to the second power supply voltage VDDB, and a source of the N-channel field-effect transistor N4 is connected to a drain of the N-channel field-effect transistor K4. A source of the N-channel field-effect transistor K4 is connected to the third power supply voltage VSS. A gate of the P-channel field-effect transistor P4 and a gate of the N-channel field-effect transistor N4 receive the output signal OUT. A gate of the N-channel field-effect transistor K4 receives the first power supply voltage VDDA.

Figure 2:
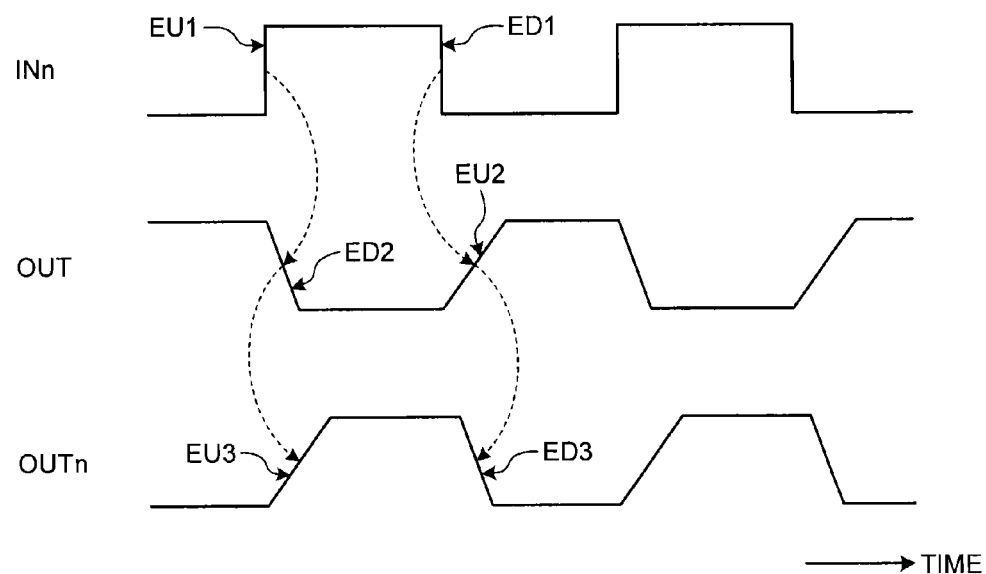
FIG. 2 is a timing chart illustrating voltage waveforms of respective units in the level shift circuit of FIG. 1.

FIG. 2 is a timing chart illustrating voltage waveforms of respective units in the level shift circuit of FIG. 1.

Referring to FIG. 2, when the input signal IN is input to the CMOS inverter 1, the input signal IN is inverted by the CMOS inverter 1, and thus the input signal INn having an amplitude of VDDA is generated and input to the CMOS inverter 3. The input signal INn is inverted in the CMOS inverter 3, and thus the output signal OUT having an amplitude of VDDB is generated and input to the CMOS inverter 4. The output signal OUT is inverted in the CMOS inverter 4, and thus an output signal OUTn having an amplitude of VDDB is generated.

Herein, the CMOS inverter 3 has the delay time in a rising edge EU2 that is longer than the delay time in a falling edge ED2 of the output signal OUT. The CMOS inverter 4 has the delay time in a rising edge EU3 that is longer than the delay time in a falling edge ED3 of the output signal OUTn.

At this time, when the CMOS inverter 3 generates the falling edge ED2 of the output signal OUT according to the rising edge EU1 of the input signal INn and generates the rising edge EU2 of the output signal OUT according to the falling edge ED1 of the input signal INn, the delay in the rising edge EU2 with respect to the falling edge ED1 becomes larger than the delay in the falling edge ED2 with respect to the rising edge EU1.

In addition, when the CMOS inverter 4 generates the rising edge EU3 of the output signal OUTn according to the falling edge ED2 of the output signal OUT and generates the falling edge ED3 of the output signal OUTn according to the rising edge EU2 of the output signal OUT, the delay in the rising edge EU3 with respect to the falling edge ED2 becomes shorter than the delay in the falling edge ED3 with respect to the rising edge EU2.

As a result, the longer delay in the rising edge EU2 with respect to the falling edge ED1 compared with the delay in the falling edge ED2 with respect to the rising edge EU1 can be cancelled by the shorter delay in the rising edge EU3 with respect to the falling edge ED2 compared with the delay in the falling edge ED3 with respect to the rising edge EU2. For this reason, it is possible to reduce a skew which is attributable to process variation in characteristics between the P-channel field-effect transistor P3 and the N-channel field-effect transistor N3.

In addition, in a case where the CMOS inverter 3 receives the input signal INn at a high level, the first power supply voltage VDDA is applied to the gate of the N-channel field-effect transistor N3, and a gate-source voltage Vgs of the N-channel field-effect transistor N3 is determined based on the first power supply voltage VDDA and the third power supply voltage VSS. On the other hand, in a case where the input signal INn is at a low level, the third power supply voltage VSS is applied to the gate of the P-channel field-effect transistor P3, and the gate-source voltage Vgs of the P-channel field-effect transistor P3 is determined based on the second power supply voltage VDDB and the third power supply voltage VSS.

For this reason, the gate-source voltage Vgs of the N-channel field-effect transistor N3 becomes greater than that of the P-channel field-effect transistor P3, and thus the current driving force becomes strong. Consequently, in the CMOS inverter 3, the falling edge of the output signal OUT is made faster than the rising edge thereof.

Herein, by way of connecting the N-channel field-effect transistor K3 to the source of the N-channel field-effect transistor N3, it is possible to make the current driving force of the N-channel field-effect transistor N3 lowered, thereby making the current driving forces between the N-channel field-effect transistor N3 and the P-channel field-effect transistor P3 uniform. For this reason, it is possible to reduce the skew which is attributable to a difference between the gate-source voltages Vgs of the P-channel field-effect transistor P3 and the N-channel field-effect transistor N3.

In addition, similarly in the CMOS inverter 4, by way of connecting the N-channel field-effect transistor K4 to the source of the N-channel field-effect transistor N4, it is possible to make the current driving forces between the N-channel field-effect transistor N4 and the P-channel field-effect transistor P4 uniform. Therefore, it is possible to reduce the skew which is attributable to a difference between the gate-source voltages Vgs of the P-channel field-effect transistor P4 and the N-channel field-effect transistor N4.

In addition, in a case where the input signal INn is at the high level, the first power supply voltage VDDA is applied to the gate of the N-channel field-effect transistor N3; and in a case where the output signal OUT is at the high level, the second power supply voltage VDDB is applied to the gate of the N-channel field-effect transistor N4. For this reason, by way of applying the second power supply voltage VDDB to the gate of the N-channel field-effect transistor K3 as well as applying the first power supply voltage VDDA to the gate of the N-channel field-effect transistor K4, it is possible to make the resistance at the low level when viewed from the output stage of the CMOS inverter 3 and the resistance at the low level when viewed from the output stage of the CMOS inverter 4 uniform. Therefore, it is possible to reduce not only the skew which is attributable to a difference between the gate-source voltages Vgs but also the skew which is attributable to the process variation.

Second Embodiment

Figure 3:
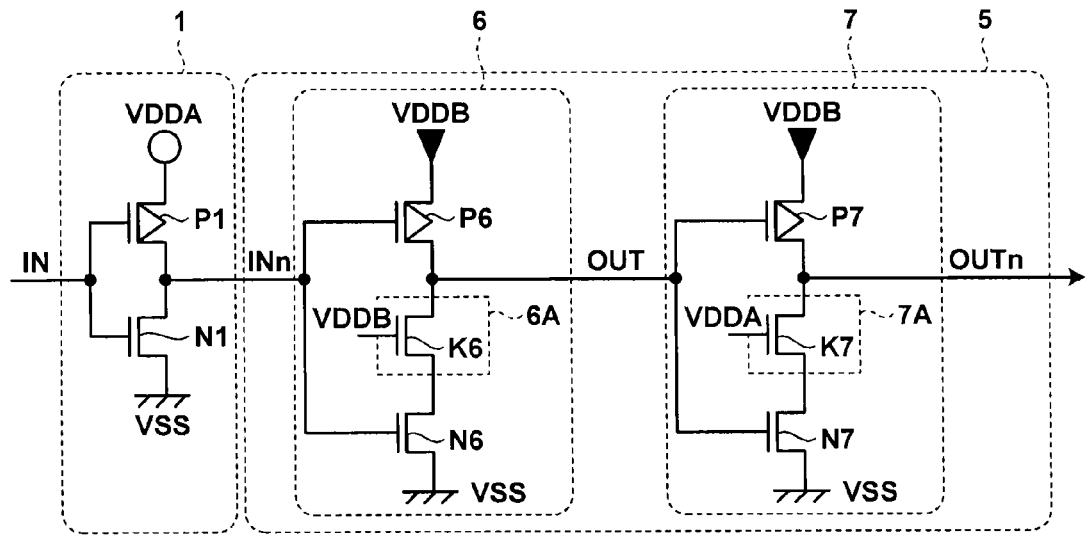
FIG. 3 is a circuit diagram schematically illustrating a configuration of a level shift circuit according to a second embodiment.

FIG. 3 is a circuit diagram schematically illustrating a configuration of a level shift circuit according to a second embodiment.

Referring to FIG. 3, a level shift circuit 5 is provided with CMOS inverters 6 and 7, and the CMOS inverter 7 is connected to a rear stage of the CMOS inverter 6. A CMOS inverter 1 is connected to a front stage of the CMOS inverter 6.

The CMOS inverter 6 is driven by a second power supply voltage VDDB, and can make an input signal INn from the CMOS inverter 1 inverted. The CMOS inverter 7 is driven by the second power supply voltage VDDB, and can make an output signal OUT from the CMOS inverter 6 inverted.

In addition, the CMOS inverter 6 is provided with a driving adjustment circuit 6A, and the CMOS inverter 7 is provided with a driving adjustment circuit 7A. The driving adjustment circuit 6A can adjust a current driving force of a low level output of the CMOS inverter 6. The driving adjustment circuit 7A can adjust the current driving force of a low level output of the CMOS inverter 7.

Specifically, the CMOS inverter 6 is provided with a P-channel field-effect transistor P6 and an N-channel field-effect transistor N6. In addition, the CMOS inverter 7 is provided with a P-channel field-effect transistor P7 and an N-channel field-effect transistor N7. The driving adjustment circuit 6A is provided with an N-channel field-effect transistor K6. The driving adjustment circuit 7A is provided with an N-channel field-effect transistor K7.

The N-channel field-effect transistor K6 is connected in series to a drain of the N-channel field-effect transistor N6. The P-channel field-effect transistor P6 is connected in series to the N-channel field-effect transistor N6 through the N-channel field-effect transistor K6. A source of the P-channel field-effect transistor P6 is connected to the second power supply voltage VDDB, and a source of the N-channel field-effect transistor N6 is connected to a third power supply voltage VSS. A gate of the P-channel field-effect transistor P6 and a gate of the N-channel field-effect transistor N6 receive the input signal INn. A gate of the N-channel field-effect transistor K6 receives the second power supply voltage VDDB.

In addition, the N-channel field-effect transistor K7 is connected in series to a drain of the N-channel field-effect transistor N7. The P-channel field-effect transistor P7 is connected in series to the N-channel field-effect transistor N7 through the N-channel field-effect transistor K7. A source of the P-channel field-effect transistor P7 is connected to the second power supply voltage VDDB, and a source of the N-channel field-effect transistor N7 is connected to the third power supply voltage VSS. A gate of the P-channel field-effect transistor P7 and a gate of the N-channel field-effect transistor N7 receive the output signal OUT. A gate of the N-channel field-effect transistor K7 receives the first power supply voltage VDDA.

Herein, the level shift circuit 5 can compensate a delay time in a rising edge of an output voltage from the CMOS inverter 6 at the front stage with a delay time in the falling edge of an output voltage from the CMOS inverter 7 at the rear stage. Further, the level shift circuit 5 can compensate a delay time in a falling edge of the output voltage from the CMOS inverter 6 at the front stage with a delay time in a rising edge of the output voltage from the CMOS inverter 7 at the rear stage.

In addition, in a case where the CMOS inverter 6 receives the input signal INn at a high level, the first power supply voltage VDDA is applied to the gate of the N-channel field-effect transistor N6, and the gate-source voltage Vgs of the N-channel field-effect transistor N6 is determined based on the first power supply voltage VDDA and the third power supply voltage VSS. On the other hand, in a case where the input signal INn is at a low level, the third power supply voltage VSS is applied to the gate of the P-channel field-effect transistor P6, and the gate-source voltage Vgs of the P-channel field-effect transistor P6 is determined based on the second power supply voltage VDDB and the third power supply voltage VSS.

For this reason, the gate-source voltage Vgs of the N-channel field-effect transistor N6 becomes greater than that of the P-channel field-effect transistor P6, and thus the current driving force becomes strong. Consequently, in the CMOS inverter 6, the falling edge of the output signal OUT is made faster than the rising edge thereof.

Herein, by way of connecting the N-channel field-effect transistor K6 to the drain of the N-channel field-effect transistor N6, it is possible to make the current driving force of the N-channel field-effect transistor N6 lowered, thereby making the current driving force between the N-channel field-effect transistor N6 and the P-channel field-effect transistor P6 uniform. For this reason, it is possible to reduce the skew which is attributable to a difference between the gate-source voltages Vgs of the P-channel field-effect transistor P6 and the N-channel field-effect transistor N6.

In addition, similarly in the CMOS inverter 7, by way of connecting the N-channel field-effect transistor K7 to the drain of the N-channel field-effect transistor N7, it is possible to make the current driving forces between the N-channel field-effect transistor N7 and the P-channel field-effect transistor P7 uniform. Therefore, it is possible to reduce the skew which is attributable to a difference between the gate-source voltages Vgs of the P-channel field-effect transistor P7 and the N-channel field-effect transistor N7.

In addition, by way of applying the second power supply voltage VDDB to the gate of the N-channel field-effect transistor K6 as well as applying the first power supply voltage VDDA to the gate of the N-channel field-effect transistor K7, it is possible to make the resistance at the low level when viewed from the output stage of the CMOS inverter 6 and the resistance at the low level when viewed from the output stage of the CMOS inverter 7 uniform. Therefore, it is possible to reduce not only the skew which is attributable to a difference between the gate-source voltages Vgs but also the skew which is attributable to the process variation.

Third Embodiment

Figure 4:
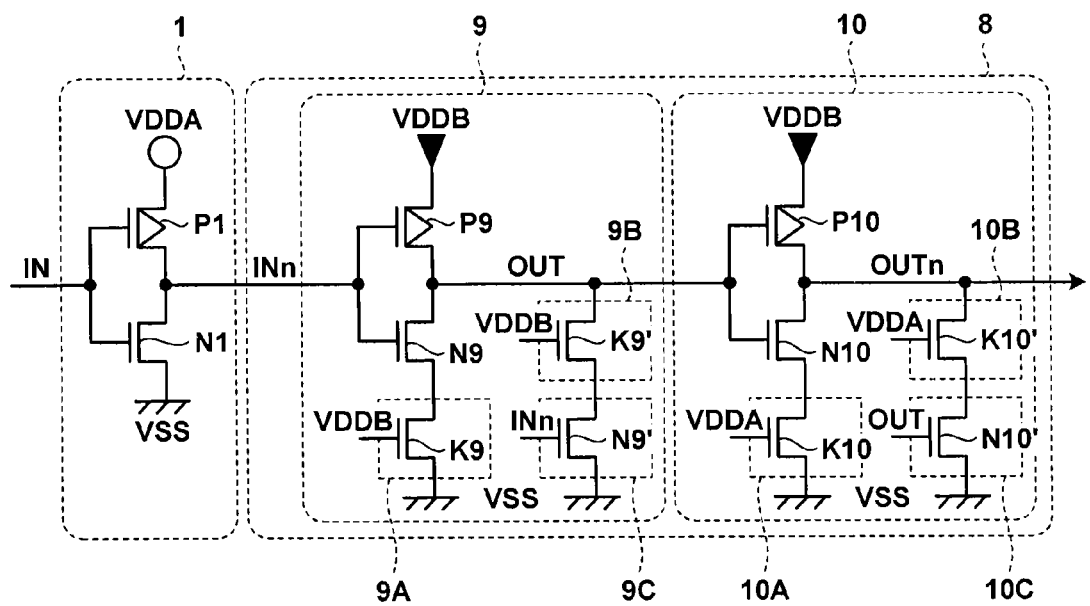
FIG. 4 is a circuit diagram schematically illustrating a configuration of a level shift circuit according to a third embodiment.

FIG. 4 is a circuit diagram schematically illustrating a configuration of a level shift circuit according to a third embodiment.

Referring to FIG. 4, a level shift circuit 8 is provided with CMOS inverters 9 and 10, and the CMOS inverter 10 is connected to a rear stage of the CMOS inverter 9. A CMOS inverter 1 is connected to a front stage of the CMOS inverter 9.

The CMOS inverter 9 is driven by a second power supply voltage VDDB, and can make an input signal INn from the CMOS inverter 1 inverted. The CMOS inverter 10 is driven by the second power supply voltage VDDB, and can make an output signal OUT from the CMOS inverter 9 inverted.

In addition, the CMOS inverter 9 is provided with driving adjustment circuits 9A and 9B and a pull-down circuit 9C, and the CMOS inverter 10 is provided with driving adjustment circuits 10A and 10B and a pull-down circuit 10C. The driving adjustment circuits 9A and 9B can adjust a current driving force of a low level output of the CMOS inverter 9. The driving adjustment circuits 10A and 10B can adjust a current driving force of a low level output of the CMOS inverter 10. The pull-down circuit 9C can make the output signal OUT of the CMOS inverter 9 pulled down based on the input signal INn. The pull-down circuit 10C can make an output signal OUTn of the CMOS inverter 10 pulled down based on the output signal OUT.

Specifically, the CMOS inverter 9 is provided with a P-channel field-effect transistor P9 and an N-channel field-effect transistor N9. The CMOS inverter 10 is provided with a P-channel field-effect transistor P10 and an N-channel field-effect transistor N10. The driving adjustment circuit 9A is provided with an N-channel field-effect transistor K9. The driving adjustment circuit 9B is provided with an N-channel field-effect transistor K9'. The pull-down circuit 9C is provided with an N-channel field-effect transistor N9'. The driving adjustment circuit 10A is provided with an N-channel field-effect transistor K10. The driving adjustment circuit 10B is provided with an N-channel field-effect transistor K10'. The pull-down circuit 10C is provided with an N-channel field-effect transistor N10'.

Further, a gate width of the P-channel field-effect transistor P9 can be configured to be equal to the sum of gate widths of the N-channel field-effect transistors N9 and N9'. In addition, the gate widths of the N-channel field-effect transistors N9 and N9' can be configured to be equal to each other. Herein, the N-channel field-effect transistors N9 and N9' can perform a pull-down operation of the CMOS inverter 9 in a coordinated manner.

A gate width of the P-channel field-effect transistor P10 can be configured to be equal to the sum of gate widths of the N-channel field-effect transistors N10 and N10'. In addition, the gate widths of the N-channel field-effect transistors N10 and N10' can be configured to be equal to each other. Herein, the N-channel field-effect transistors N10 and N10' can perform a pull-down operation of the CMOS inverter 10 in a coordinated manner.

The P-channel field-effect transistor P9 and the N-channel field-effect transistor N9 are connected in series to each other. A source of the P-channel field-effect transistor P9 is connected to the second power supply voltage VDDB, and a source of the N-channel field-effect transistor N9 is connected to a drain of the N-channel field-effect transistor K9. A source of the N-channel field-effect transistor K9 is connected to a third power supply voltage VSS.

In addition, the N-channel field-effect transistor K9' is connected in series to a drain of the N-channel field-effect transistor N9'. In addition, a drain of the N-channel field-effect transistor K9' is connected to a drain of the P-channel field-effect transistor P9. A source of the N-channel field-effect transistor N9' is connected to the third power supply voltage VSS. A gate of the P-channel field-effect transistor P9 and gates of the N-channel field-effect transistors N9 and N9' receive the input signal INn. Gates of the N-channel field-effect transistors K9 and K9' receive the second power supply voltage VDDB.

The P-channel field-effect transistor P10 and the N-channel field-effect transistor N10 are connected in series to each other. A source of the P-channel field-effect transistor P10 is connected to the second power supply voltage VDDB, and a source of the N-channel field-effect transistor N10 is connected to a drain of the N-channel field-effect transistor K10. A source of the N-channel field-effect transistor K10 is connected to the third power supply voltage VSS.

In addition, the N-channel field-effect transistor K10' is connected in series to a drain of the N-channel field-effect transistor N10'. In addition, a drain of the N-channel field-effect transistor K10' is connected to a drain of the P-channel field-effect transistor P10. A source of the N-channel field-effect transistor N10' is connected to the third power supply voltage VSS. A gate of the P-channel field-effect transistor P10 and gates of the N-channel field-effect transistors N10 and N10' receive the output signal OUT. Gates of the N-channel field-effect transistors K10 and K10' receive the first power supply voltage VDDA.

Herein, the level shift circuit 8 can compensate a delay time in a rising edge of an output voltage from the CMOS inverter 9 at the front stage with a delay time in the falling edge of an output voltage from the CMOS inverter 10 at the rear stage. Further, the level shift circuit 8 can compensate a delay time in a falling edge of the output voltage from the CMOS inverter 9 at the front stage with a delay time in a rising edge of the output voltage from the CMOS inverter 10 at the rear stage.

In addition, in a case where the CMOS inverter 9 receives the input signal INn at a high level, the first power supply voltage VDDA is applied to the gates of the N-channel field-effect transistors N9 and N9', and the gate-source voltages Vgs of the N-channel field-effect transistors N9 and N9' are determined based on the first power supply voltage VDDA and the third power supply voltage VSS. On the other hand, in a case where the input signal INn is at a low level, the third power supply voltage VSS is applied to the gate of the P-channel field-effect transistor P9, and the gate-source voltage Vgs of the P-channel field-effect transistor P9 is determined based on the second power supply voltage VDDB and the third power supply voltage VSS.

For this reason, the gate-source voltages Vgs of the N-channel field-effect transistors N9 and N9' become greater than that of the P-channel field-effect transistor P9, and thus the current driving force becomes strong. Consequently, in the CMOS inverter 9, the falling edge of the output signal OUT is made faster than the rising edge thereof.

Herein, by way of connecting the N-channel field-effect transistor K9 to the source of the N-channel field-effect transistor N9 as well as connecting the N-channel field-effect transistor K9' to the drain of the N-channel field-effect transistor N9', it is possible to make the current driving forces of the N-channel field-effect transistors N9 and N9' lowered, thereby making the current driving forces between the N-channel field-effect transistors N9 and N9' and the P-channel field-effect transistor P9 uniform. For this reason, it is possible to reduce the skew which is attributable to a difference between the gate-source voltages Vgs of the P-channel field-effect transistor P9 and the N-channel field-effect transistors N9 and N9'.

In addition, similarly in the CMOS inverter 10, by way of connecting the N-channel field-effect transistor K10 to the source of the N-channel field-effect transistor N10 as well as connecting the N-channel field-effect transistor K10' is connected to the drain of the N-channel field-effect transistor N10', it is possible to make the current driving forces between the N-channel field-effect transistors N10 and N10' and the P-channel field-effect transistor P10 uniform. Therefore, it is possible to reduce the skew which is attributable to a difference between the gate-source voltages Vgs of the P-channel field-effect transistor P10 and the N-channel field-effect transistors N10 and N10'.

In addition, in a case where the input signal INn is at a high level, the first power supply voltage VDDA is applied to the gates of the N-channel field-effect transistors N9 and N9'; and in a case where the output signal OUT is at a high level, the second power supply voltage VDDB is applied to the gates of the N-channel field-effect transistors N10 and N10'. For this reason, by way of applying the second power supply voltage VDDB to the gates of the N-channel field-effect transistors K9 and K9' as well as applying the first power supply voltage VDDA to the gates of the N-channel field-effect transistors K10 and K10', it is possible to make the gate-source voltages Vgs of the N-channel field-effect transistors K9 and N9' and the gate-source voltages Vgs of the N-channel field-effect transistors K10 and N10', which are near the third power supply voltage VSS, uniform. Further, it is possible to make the gate-source voltages Vgs of the N-channel field-effect transistors K9' and N9 and the gate-source voltages Vgs of the N-channel field-effect transistors K10' and N10, which are on the output sides of the CMOS inverters 9 and 10, uniform. As a result, it is possible to make the output characteristics of the CMOS inverters 9 and 10 uniform, and the skew which is attributable to the process variation can be reduced as well as the skew which is attributable to a difference of the gate-source voltages Vgs.

Fourth Embodiment

Figure 5:
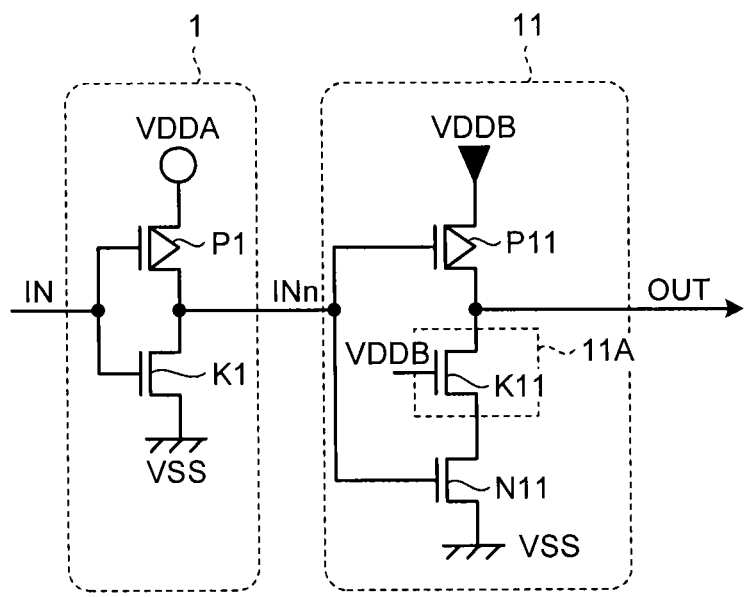
FIG. 5 is a circuit diagram schematically illustrating a configuration of a level shift circuit according to a fourth embodiment.

FIG. 5 is a circuit diagram schematically illustrating a configuration of a level shift circuit according to a fourth embodiment.

Referring to FIG. 5, the level shift circuit is provided with a CMOS inverter 11, and a CMOS inverter 1 is connected to a front stage of the CMOS inverter 11.

The CMOS inverter 11 is driven by a second power supply voltage VDDB, and can make an input signal INn from the CMOS inverter 1 inverted. In addition, the CMOS inverter 11 is provided with a driving adjustment circuit 11A. The driving adjustment circuit 11A can adjust the current driving force of the low level output of the CMOS inverter 11.

Specifically, the CMOS inverter 11 is provided with a P-channel field-effect transistor P11 and an N-channel field-effect transistor N11. The driving adjustment circuit 11A is provided with an N-channel field-effect transistor K11.

The N-channel field-effect transistor K11 is connected in series to a drain of the N-channel field-effect transistor N11. The P-channel field-effect transistor P11 is connected in series to the N-channel field-effect transistor N11 through the N-channel field-effect transistor K11. A source of the P-channel field-effect transistor P11 is connected to the second power supply voltage VDDB, and a source of the N-channel field-effect transistor N11 is connected to a third power supply voltage VSS. A gate of the P-channel field-effect transistor P11 and a gate of the N-channel field-effect transistor N11 receive the input signal INn. A gate of the N-channel field-effect transistor K11 receives the second power supply voltage VDDB.

Figure 6:
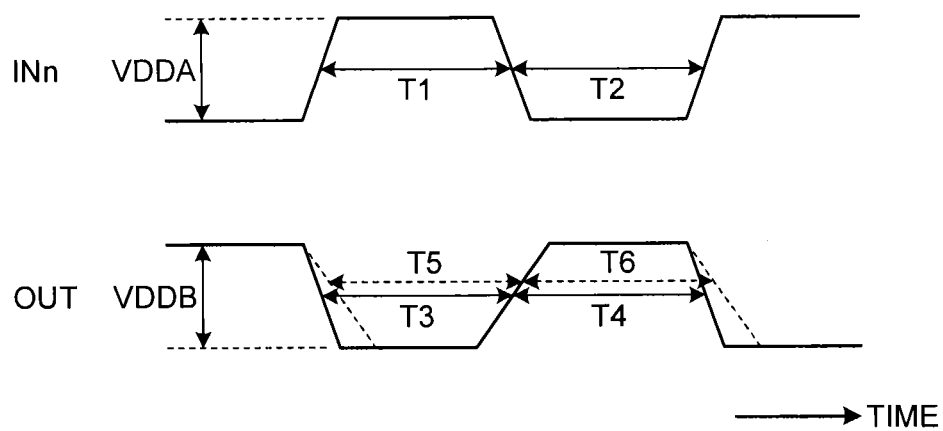
FIG. 6 is a timing chart illustrating voltage waveforms of respective units in the level shift circuit of FIG. 5.

FIG. 6 is a timing chart illustrating voltage waveforms of respective units in the level shift circuit of FIG. 5.

Referring to FIG. 6, when an input signal IN is input to the CMOS inverter 1, the input signal IN is inverted by the CMOS inverter 1, and thus the input signal INn having an amplitude of VDDA is generated and input to the CMOS inverter 11. At this time, a period T1 of the input signal INn at a high level can be equal to a period T2 at a low level.

In a case where the input signal INn is at the high level, the first power supply voltage VDDA is applied to the gate of the N-channel field-effect transistor N11, and the gate-source voltage Vgs of the N-channel field-effect transistor N11 is determined based on the first power supply voltage VDDA and the third power supply voltage VSS. On the other hand, in a case where the input signal INn is at the low level, the third power supply voltage VSS is applied to the gate of the P-channel field-effect transistor P11, and the gate-source voltage Vgs of the P-channel field-effect transistor P11 is determined based on the second power supply voltage VDDB and the third power supply voltage VSS.

For this reason, the gate-source voltage Vgs of the N-channel field-effect transistor N11 becomes greater than that of the P-channel field-effect transistor P11, and thus the current driving force becomes strong. Consequently, in the CMOS inverter 11, the falling edge of the output signal OUT is made faster than the rising edge thereof, and a period T4 of the output signal OUT at the high level becomes shorter than a period T3 at the low level.

Herein, by way of connecting the N-channel field-effect transistor K11 to the drain of the N-channel field-effect transistor N11, it is possible to make the current driving force of the N-channel field-effect transistor N11 lowered, thereby making the current driving force between the N-channel field-effect transistor N11 and the P-channel field-effect transistor P11 uniform. For this reason, it is possible to make the period T4 of the output signal OUT at the high level longer to be a period T6 at the high level, and also the period T3 of the output signal OUT at the low level shorter to be a period T5 at the low level. Therefore, it is possible to reduce the skew which is attributable to a difference between the gate-source voltages Vgs of the P-channel field-effect transistor P11 and the N-channel field-effect transistor N11.

In addition, by way of connecting the N-channel field-effect transistor K11 to the drain of the N-channel field-effect transistor N11, it is possible not to make the N-channel field-effect transistor N11 applied with a back bias, thereby reducing a distortion in the output signal OUT.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A level shift circuit comprising:
    a first CMOS inverter which receives an input signal corresponding to a first power supply voltage, and is driven by a second power supply voltage which is smaller than the first power supply voltage;
    a second CMOS inverter which is connected to a rear stage of the first CMOS inverter, and is driven by the second power supply voltage;
    a first driving adjustment circuit connected to said first CMOS inverter and the second supply voltage to adjust a current driving force of a low level output of the first CMOS inverter; and
    a second driving adjustment circuit connected to the second CMOS inverter to adjust a current driving force of a low level output of the second CMOS inverter responsive to said the first power supply voltage.

2. The level shift circuit according to claim 1, wherein a delay time in a rising edge of an output voltage of the first CMOS inverter is compensated with a delay time in a falling edge of an output voltage of the second CMOS inverter, and a delay time in a falling edge of the output voltage of the first CMOS inverter is compensated with a delay time in a rising edge of the output voltage of the second CMOS inverter.

3. The level shift circuit according to claim 1, wherein the first driving adjustment circuit includes a second N-channel field-effect transistor which is connected in series to a source of a first N-channel field-effect transistor of the first CMOS inverter.

4. The level shift circuit according to claim 3, wherein the second power supply voltage is applied to a gate of the second N-channel field-effect transistor.

5. The level shift circuit according to claim 4, wherein the second driving adjustment circuit includes a fourth N-channel field-effect transistor which is connected in series to a source of a third N-channel field-effect transistor of the second CMOS inverter.

6. The level shift circuit according to claim 5, wherein the first power supply voltage is applied to a gate of the fourth N-channel field-effect transistor.

7. The level shift circuit according to claim 1, wherein the first driving adjustment circuit includes a second N-channel field-effect transistor which is connected in series to a drain of the first N-channel field-effect transistor of the first CMOS inverter.

8. The level shift circuit according to claim 7, wherein the second power supply voltage is applied to a gate of the second N-channel field-effect transistor.

9. The level shift circuit according to claim 8, wherein the second driving adjustment circuit includes a fourth N-channel field-effect transistor which is connected in series to a drain of a third N-channel field-effect transistor of the second CMOS inverter.

10. The level shift circuit according to claim 9, wherein the first power supply voltage is applied to a gate of the fourth N-channel field-effect transistor.

11. The level shift circuit according to claim 1, further comprising:
a first pull-down circuit which makes a first output signal of the first CMOS inverter pulled down based on the input signal;
a second pull-down circuit which makes a second output signal of the second CMOS inverter pulled down based on the first output signal;
a third driving adjustment circuit which adjusts a current driving force of the first pull-down circuit; and
a fourth driving adjustment circuit which adjusts a current driving force of the second pull-down circuit.

12. The level shift circuit according to claim 11, wherein the first CMOS inverter includes:
a first P-channel field-effect transistor in which the input signal is applied to a gate thereof; and
a first N-channel field-effect transistor in which the input signal is applied to a gate thereof, and which is connected in series to the first P-channel field-effect transistor, and
the second CMOS inverter includes:
a second P-channel field-effect transistor in which the first output signal is applied to a gate thereof; and
a second N-channel field-effect transistor in which the first output signal is applied to a gate thereof, and which is connected in series to the second P-channel field-effect transistor.

13. The level shift circuit according to claim 12, wherein the first pull-down circuit includes a third N-channel field-effect transistor in which the input signal is applied to a gate thereof, and
the second pull-down circuit includes a fourth N-channel field-effect transistor in which the first output signal is applied to a gate thereof.

14. The level shift circuit according to claim 13, wherein
the first driving adjustment circuit includes a fifth N-channel field-effect transistor which is connected in series to a source of the first N-channel field-effect transistor,
the second driving adjustment circuit includes a sixth N-channel field-effect transistor which is connected in series to a source of the second N-channel field-effect transistor,
the third driving adjustment circuit includes a seventh N-channel field-effect transistor which is connected in series to a drain of the third N-channel field-effect transistor, and
the fourth driving adjustment circuit includes an eighth N-channel field-effect transistor which is connected in series to a drain of the fourth N-channel field-effect transistor.

15. The level shift circuit according to claim 14, wherein
the second power supply voltage is applied to gates of the fifth and the seventh N-channel field-effect transistors, and
the first power supply voltage is applied to gates of the sixth and the eighth N-channel field-effect transistors.

16. The level shift circuit according to claim 15, wherein a gate width of the first P-channel field-effect transistor is equal to a sum of a gate width of the first N-channel field-effect transistor and a gate width of the third N-channel field-effect transistor.

17. The level shift circuit according to claim 16, wherein the gate width of the first N-channel field-effect transistor and the gate width of the third N-channel field-effect transistor are equal to each other.

18. The level shift circuit according to claim 15, wherein a gate width of the second P-channel field-effect transistor is equal to a sum of a gate width of the second N-channel field-effect transistor and a gate width of the fourth N-channel field-effect transistor.

19. The level shift circuit according to claim 18, wherein the gate width of the second N-channel field-effect transistor and the gate width of the fourth N-channel field-effect transistor are equal to each other.

20. The level shift circuit according to claim 1, further comprising a third CMOS inverter which is connected to a front stage of the first CMOS inverter, and is driven by the first power supply voltage.

* * * * *